United States Patent [19]

Moriguchi et al.

[11] Patent Number: 4,551,303

[45] Date of Patent: Nov. 5, 1985

[54] METHOD OF USING AN EVAPORATION SOURCE

[75] Inventors: Hiroyuki Moriguchi, Koufu; Masanori Matsumoto, Hachioji; Akira Nishiwaki, Hachioji; Yasuo Morohoshi, Hachioji; Hiroyuki Nomori, Hachioji, all of Japan

[73] Assignee: Konishiroku Photo Industry Co., Ltd., Tokyo, Japan

[21] Appl. No.: 528,215

[22] Filed: Aug. 31, 1983

[30] Foreign Application Priority Data

Sep. 4, 1982 [JP] Japan ................................ 57-154240
Sep. 4, 1982 [JP] Japan ................................ 57-154241

[51] Int. Cl.$^4$ ............................................. C22C 28/00
[52] U.S. Cl. ...................................... 420/590; 427/76; 420/579
[58] Field of Search ................... 420/590, 579; 427/76; 96/1.5 R

[56] References Cited

U.S. PATENT DOCUMENTS 4,126,457 11/1978 Ciuffini ............................ 96/1.5 R Primary Examiner—L. Dewayne Rutledge
Assistant Examiner—Christopher W. Brody
Attorney, Agent, or Firm—Finnegan, Henderson, Farabow, Garrett & Dunner

[57] ABSTRACT

An evaporation source designed so that two or more materials to be evaporated are heated to evaporate by respective heaters, as well as method of using such an evaporation source are disclosed. The evaporation source further includes means for detecting the temperature of the slowly evaporating material and means for controlling the heaters on the basis of the detected temperature. The method of using this evaporation source comprises controlling the temperature of the slowly evaporating material in order to control the temperature of the evaporation source in such a manner that the respective materials are simultaneously heated to evaporate and deposit a film on a substrate.

11 Claims, 7 Drawing Figures

METHOD OF USING AN EVAPORATION SOURCE

BACKGROUND OF THE INVENTION

1. Field of the Invention

The present invention relates to an evaporation source including two or more materials to be heated to evaporate by respective heaters, as well as a method of using said evaporation source.

2. Description of the Prior Art

Photoreceptors made of selenium-tellurium alloys are sometimes produced by evaporation techniques using open boats or Knudsen cells. In Knudsen cells, the container (or boat) containing the material to be evaporated has an opening in the top which is tapered to have a smaller cross section than the area of evaporation. Having this configuration, the Knudsen cell is superior to the open boat because it is capable of effective control over the evaporation rate and any vapor that is formed by "bumping" is deposited on the inner wall of the container without flying through the opening to reach the substrate outside the container.

A Knudsen cell of single container type that is simple in construction and which is easy to operate and ensures consistent evaporation is disclosed in Japanese Patent Application (OPI) No. 176361/80 (the symbol OPI as used herein means an unexamined published Japanese patent application). As shown in FIG. 1, this evaporation source consists of a single container 1 which is divided into two compartments by a partition 2. Two evaporating materials of selenium-tellurium alloys 3 and 4 having different concentrations of tellurium element are placed in the two compartments and heated to evaporate by respective heaters 5 and 6. The resulting vapors of the two evaporating materials are mixed and pass through an opening 7 in the top of the container to be directed onto a substrate 8 wound around a drum positioned above the container. The profile of Te concentration in the deposited film on the substrate can be controlled by varying the temperatures at which the two evaporating materials are heated.

However, it turned out that this known cell and the method of using it have the following defects. When the two evaporating materials of selenium-tellurium alloys are heated, the one having the greater evaporation rate (or the lower Te concentration) evaporates faster than the other having the smaller evaporation rate (or the higher Te concentration). Therefore, if the temperature control of the cell is effected on the basis of the temperature of the fast evaporating material of alloy as measured by a thermocouple inserted into it, said thermocouple reads the highest temperature when the greater part or all of the fast evaporating material has evaporated. Based on this high temperature, each heater is fed with a control signal for reducing the heater output, and the total output of the heaters is greatly reduced. As a result, the temperature in the container is decreased so much that consistent evaporation cannot be ensured without causing undesired deposition of the vapor on the inner wall of the container. If too much vapor is deposited on the inner container wall, photoreceptors having variations in sensitivity or reduced fatigue characteristics are produced.

SUMMARY OF THE INVENTION

Therefore, one object of the present invention is to provide an evaporation source that retains the advantages of the Knudsen cell and which yet eliminates its defects so as to produce a vapor-deposited film having the desired profile of the concentrations of the components as well as good film properties.

Another object of the present invention is to provide a method of using such evaporation source.

The first object of the present invention can be achieved by an evaporation source designed so that two or more materials to be evaporated are heated to evaporate by respective heaters, said evaporation source comprising means for detecting the temperature of the material which is slower in evaporation and means for controlling said respective heaters on the basis of the temperature detected by said detecting means.

According to the present invention, the temperature of the evaporation source can be controlled by the information on the temperature of the slowly evaporating material, and until almost all of that material has been evaporated (even if all of the other fast evaporating material has been evaporated), the output of each heater, and hence the temperature of the evaporation source can be held constant. As a result, no temperature drop occurs during the process of evaporation and a vapor-deposited film having the desired concentration profile, as well as good film properties (e.g. sensitivity, surface quality and fatigue resistance) can be produced without vapor deposition on the inner wall of the container.

The second object of the present invention can be achieved by a method of using an evaporation source designed so that two or more materials to be evaporated are heated to evaporate by respective heaters, wherein the temperature of the material which is slower in evaporation is controlled to control said respective heaters so that materials are simultaneously heated to evaporate and deposit a film on a substrate. In this method, selenium alloys may be used as the materials to be evaporated. The alloying element other than selenium may be the same or different, and in the former case, the concentration of that element may vary from one alloy to another.

DETAILED DESCRIPTION OF THE PREFERRED EMBODIMENTS

Figure 1:
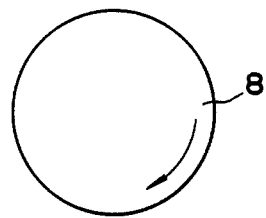
FIG. 1 is a schematic diagram of the essential part of the conventional vacuum vapor deposition apparatus.
Figure 1:
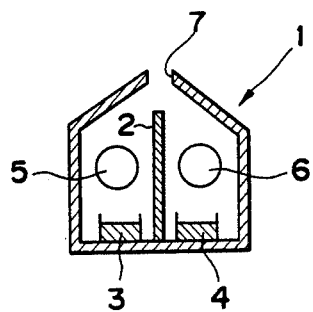
Figure 2:
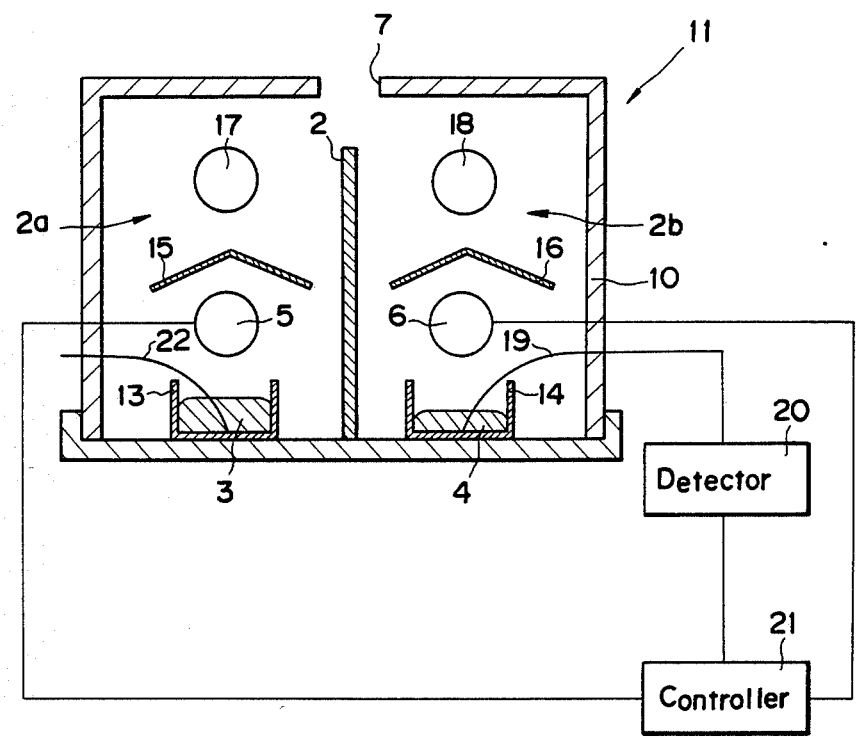
FIG. 2 is a side elevational section of the evaporation source according to one embodiment of the present invention.

FIG. 2 is a side elevational section of the evaporation source according to one embodiment of the present invention. The evaporation source generally indicated at 11 is configured as a Knudsen cell. The cell consists of container 10 which is divided by a partition 2 into two compartments 2a and 2b which contain the first evaporating material 3 of Se-Te alloy and the second evaporating material 4 of Se-Te alloy in respective inside dishes 13 and 14 in the container 10. The two evaporating materials have different Te concentrations. Heaters 5 and 6 are positioned above the respective evaporating materials of alloy. Further, above them, bumping baffles 15 and 16, as well as heaters 17 and 18 for accelerating vapors and preventing their condensation are positioned.

Suppose the first evaporating material 3 is a fast evaporating Se-Te alloy with a Te content of 4 wt% and the second evaporating material 4 is a slowly evaporating Se-Te alloy with a Te content of 20 wt%. What is unique about the evaporation source of FIG. 2 is that the information on the temperature measured by a thermocouple 19 inserted into the slowly evaporating material 4 is fed into a control circuit 21 through a detector 20, and this control circuit 21 controls the power of each of the heaters 6 and 5. Because of this arrangement, the temperature of the evaporation source is held constant on the basis of the temperature of the slowly evaporating material 4 and at the same time, the temperature of the fast evaporating material 3 (hence the temperature in the compartment 2a) is held high. A thermocouple 22 inserted into the fast evaporating material 3 takes no part in the control over the temperature of the evaporation source and is used only for the purpose of measuring the temperature of that particular material.

Figure 3:
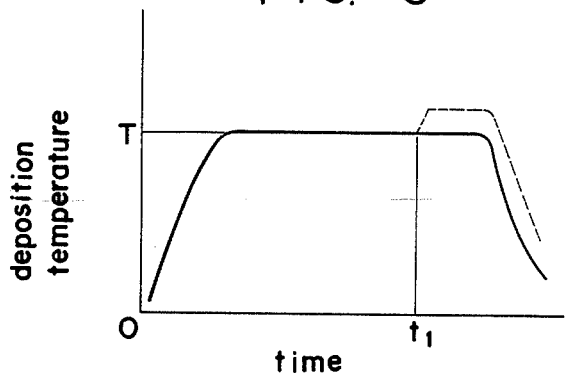
FIG. 3 is a diagram showing the program of temperature control with the evaporation source of FIG. 2.

FIG. 3 is a diagram showing the program for controlling the temperature of the evaporation source according to the concept of the present invention. When the heaters 5 and 6 are turned on simultaneously, the respective evaporating materials are heated to a predetermined temperature T (e.g. 290° C.), which is held for a predetermined period to evaporate the materials. Even if all of the fast evaporating material 3 has evaporated at time $t_1$, the slowly evaporating material 4 continues to evaporate. If the temperature of the material 3 has reached a higher level (e.g. 300° C.) indicated by the dashed line, this information is not fed into the detector 20 and the temperature of the evaporation source is held at the temperature of the material 4 and the power of each heater is held constant. As a result, the temperature of the evaporation source itself is held constant and no problem such as vapor deposition on the inner wall of the container occurs.

Figure 4:
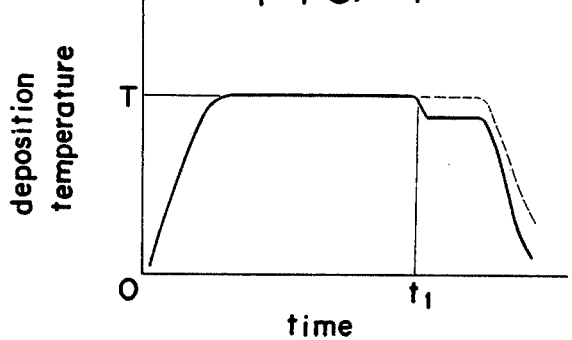
FIG. 4 is a diagram showing the program of temperature control with the conventional apparatus.

On the other hand, if the power of each heater is controlled on the basis of the temperature of the fast evaporating material 3, the power of each heater is reduced in response to the elevated temperature indicated by the dashed line in FIG. 3, and the actual temperature of the evaporation source suddenly drops at time $t_1$ as indicated by the solid line in FIG. 4.

The interior of a bell jar having the evaporation source of the present invention is preferably evacuated to a pressure of $10^{-3}$ Torr or less.

Figure 5:
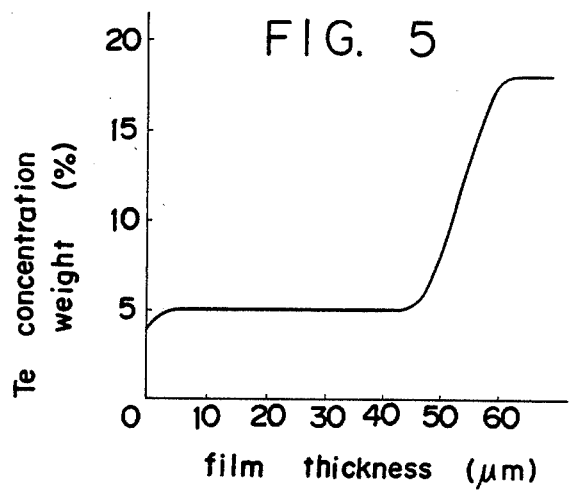
FIG. 5 is a diagram showing the profile of the tellurium concentration in the vapor-deposited film produced by the system of FIG. 2.

Deposition layer obtained with the present invention, that is, samples of Se-Te photoreceptors, which were prepared with the evaporation source of the present invention and their profile of Te concentration in the deposition layer was examined by an X-ray microanalyzer, the result of which is shown in FIG. 5. As shown, all samples had the ideal profile of Te concentration; the inner layer had a Te content of 5 wt% and had the ability to function as a charge transporting layer, whereas the surface layer had a Te content of 18 wt% and was able to function as a charge generation layer having a particularly good sensitivity to the long wavelength region due to the high Te content. These samples of photoreceptor were subjected to a copying test with U-Bix V2, an electrophotocopier by Konishiroku Photo Industry Co., Ltd., and high-density images without fog were formed.

As will be apparent from the foregoing description, the evaporation source of the present invention features a simple construction and by using it according to the method of the present invention, the concentration of a specific element in the deposited film can be easily controlled to the desired level. As shown in FIG. 5, the resulting film has the ideal concentration profile, and the photoreceptor made from this film has good electrostatic characteristics such as high sensitivity, high potential retention, low residual potential and reduced dark potential.

The concentration of tellurium in the evaporating materials 3 and 4 can be varied over a wide range. For example, the fast evaporating material 3 may have a Te concentration of from 0 to 8 wt%, and the slowly evaporating material 4 may have a Te content of 15 to 25 wt%. Tellurium may be replaced by other elements such as arsenic and antimony. These elements other than selenium may be the same or different between the two materials 3 and 4.

Figure 6:
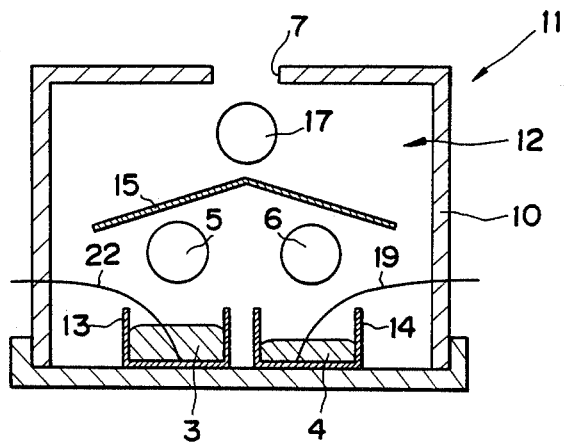
FIGS. 6 and 7 are side elevational sections of the evaporation source according to other embodiments of the present invention.

FIG. 6 shows another embodiment of the evaporation source of the present invention. In this embodiment, no partition is provided between two materials 3 and 4, and instead, common bumping baffle 15 and heater 17 are placed in the common space of the evaporation source 11. The temperature detection system and control circuit are omitted from FIG. 6. In this embodiment, vapor deposition on the inner wall of the container occurs if the heaters 5 and 6 are controlled independently of each other. This problem can be avoided by controlling the temperature of the evaporation source on the basis of the slowly evaporating material 4 as described in connection with FIG. 2.

Because of the absence of the partition 2, the embodiment of FIG. 6 permits the vapors of both materials 3 and 4 to be directed into the common space of the container, so these vapors are uniformly mixed and a vapor-deposited film having a more uniform or continuous control over the concentration of a specific element can be formed. Another advantage of eliminating the partition from the container is that the corrosion of the partition by tellurium or entrance of an impurity into the vapor-deposited film can be avoided.

Figure 7:
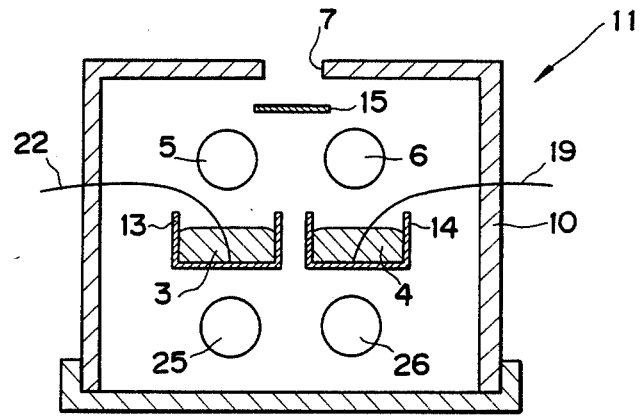

FIG. 7 shows still another embodiment of the evaporation source of the present invention. In this embodiment, the materials 3 and 4 are heated not only from above by heaters 5 and 6 but also from below by heaters 25 and 26, and this ensures more consistent heating and evaporation. A bumping baffle 15 is positioned right beneath the opening 7.

While the preferred embodiments of the present invention have been described above, it should be understood that various modifications are possible without departing from the scope of the present invention. For example, the geometry and construction of the evaporation source, as well as the arrangement and number of the materials to be evaporated can be varied according to the specific need. Suitable materials to be evaporated include not only Se-Te alloys but also Se-S, Fe-Ni and AgBr-I alloys. It is also to be mentioned that the concept of the present invention can also be applied to evaporation sources of open boat type.

What is claimed is:

1. A method of using an evaporation source designed so that two or more materials to be evaporated are heated to evaporate by respective heaters comprising detecting the temperature of material to be evaporated contained in each of a plurality of receptacles for holding materials to be evaporated, detecting the temperature of the material to be evaporated having the slowest evaporation rate, and controlling at least one heater associated with each of said receptacles and providing the energy for evaporation of the material contained in that receptacle to maintain the power delivered to each of such heaters constant as long as the temperature of said material with the slowest evaporation rate remains constant.

2. A method according to claim 1, wherein the temperature of the material having the slowest evaporation rate is detected and the information on the temperature so detected is input into a control circuit to thereby control each of said heaters associated with each of said receptacles containing the materials to be evaporated.

3. A method according to claim 1 or 2, wherein the materials vaporized are led out through an opening in a container containing said receptacles and heaters, which opening is smaller than the area of evaporation of said materials.

4. A method according to claim 1, wherein the materials to be evaporated are placed on inside dishes in a single container, and one or more partition walls are provided in said container to substantially divide the whole inner space thereof into as many compartments as appropriate.

5. A method according to claim 1, wherein the materials to be evaporated are placed in the respective compartments having independent inner spaces in the single container.

6. A method according to claim 1 or 2, wherein said heaters associated with each of said receptacles are turned on simultaneously.

7. A method according to claim 1 or 2, wherein, as the materials to be evaporated, use is made of selenium alloys.

8. A method according to claim 3, wherein as the materials to be evaporated, use is made of selenium alloys.

9. A method according to claim 6, wherein, as the materials to be evaporated, use is made of selenium alloys.

10. A method according to claim 7, wherein the element other than selenium in each selenium alloy is the same but differs in concentration.

11. A method according to claim 7, wherein the element other than selenium in each selenium alloy differs in kind.

* * * * *